United States Patent [19]
Lynch et al.

[11] Patent Number: 5,447,229
[45] Date of Patent: Sep. 5, 1995

[54] COT/TAB PROTECTIVE SHIPPING APPARATUS AND METHOD

[75] Inventors: Brian Lynch, Milpitas; Patrick O'Brien, Palo Alto; Adrian Murphy, San Jose, all of Calif.

[73] Assignee: LSI Logic Corporation, Milpitas, Calif.

[21] Appl. No.: 85,260

[22] Filed: Jun. 28, 1993

[51] Int. Cl.6 ............................................. B65D 85/42
[52] U.S. Cl. ................................. 206/706; 206/499; 206/814; 206/817; 206/718; 206/723; 220/629; 220/630
[58] Field of Search ............... 220/529, 625, 629, 630; 206/328, 334, 499, 814, 817

[56] References Cited

U.S. PATENT DOCUMENTS

| | | | |
|---|---|---|---|
| 3,497,058 | 2/1970 | Walker et al. | 206/334 |
| 4,346,817 | 8/1982 | Kascher | 206/328 X |
| 4,414,788 | 11/1983 | Berg | 206/499 X |
| 4,483,441 | 11/1984 | Akizawa et al. | 206/334 X |
| 4,485,531 | 12/1984 | Murphy | 206/328 X |
| 5,221,005 | 6/1993 | Hayward | 206/814 X |
| 5,242,051 | 9/1993 | Murphy | 206/334 X |
| 5,268,149 | 12/1993 | Arafat | 220/630 X |

*Primary Examiner*—Jacob K. Ackun
*Attorney, Agent, or Firm*—Poms, Smith, Lande & Rose

[57] ABSTRACT

Industry-standard COT/TAB integrated circuit part carrier frame members are receivable into a shipping tube member in a stack which rests at one end on paired retaining pins and at the other end is retained by a closure member of the shipping tube. As so disposed in the shipping tube, the carrier frames are securely held with virtually no risk that they will slip out of place within the shipping tube. The shipping tube member includes side walls which define plural pairs of apertures spaced along the length of the shipping tube so that: the paired pins may be relocated to adapt the shipping tube to various shipment sizes. The remainder of the shipping tube remains empty to reduce both the cost of carrier frames conventionally used just as filler, as well as reducing shipping costs by eliminating the weight of these filler carrier frames which are shipped empty.

10 Claims, 2 Drawing Sheets

COT/TAB PROTECTIVE SHIPPING APPARATUS AND METHOD

BACKGROUND OF THE INVENTION

1. Field of the Invention

The present invention is in the field of shipping containers. More particularly, the present invention relates to a shipping container and method which are especially adapted to shipping of chip on tape (COT) and tape automated bonding (TAB) integrated circuit chips.

2. Discussion of the Related Technology

Conventionally, integrated circuit chips were provided with electrical connections to their package by use of plural fine-dimension wire bonding conductors. The package included a base portion to which the chip was centrally secured and carried a lead frame with plural conductor leads radiating outwardly from around the chip toward the perimeter of the package base. Near its perimeter the package provided plural depending contact legs or surface mount contact pads to which the lead frame conductors connected and by which electrical contact between the integrated circuit chip and external electrical circuitry was effected. The plural fine-dimension wire bond conductors spanned the distance between the inner ends of the lead frame conductors and the contact pads of the integrated circuit chip itself. Understandably, the placement of these plural fine-dimension wire bond conductors was both labor and time intensive, as well as presenting a primary failure mode for integrated circuits by shorting together of the closely spaced wire bond conductors.

More recently, integrated circuit chips have been provided with electrical connection to their packages by use of a film or tape on which plural conductive traces are formed. The tape has an opening or central area surrounded by a fan or star burst of outwardly radiating conductive traces and into which the small integrated circuit chip is disposed. The integrated circuit chip is physically secured to the tape and electrical connection with the conductive traces is effected by a variety of small scale contact methods. For example, a collapsible solder ball technique may be used to effect electrical connection between the individual contact pads of the integrated circuit chip and the conductive traces of the tape member. Near its outer perimeter, the tape member defines plural individual contact pads which are connected to the inner portions of a package lead frame to effect external electrical connection of the integrated circuit chip much as described above. Understandably, because the tape member provides all of the electrical connections between the package lead frame and the integrated circuit chip, and also carries the integrated circuit chip itself, automated handling of the tape member and chip together during the completion of the packaging process is easier to accomplish.

However, in the manufacture of integrated circuits, it frequently is desirable to fabricate the integrated circuit chips and secure them to their tapes at one facility, so that they may be more easily handled for shipment to another location or facility where the packaging is completed. These integrated circuit chips on their tapes are referred to a "chip on tape" (COT), or "tape automated bonding" (TAB) parts. Because of this desirable sequence of manufacturing steps, industry-standard shipping materials have been developed. These conventional industry-standard shipping materials for COT/TAB parts include a two-part carrier frame, the parts of which nest together like a picture frame to provide a rectangular opening into which the COT/TAB part is received. The COT/TAB part is provided near the perimeter of its tape portion with plural perforations which do not interfere with the conductive electrical traces of this tape portion of the part. The carrier frame is provided with plural projecting pins which are receivable into the perforations of the COT/TAB tape. Consequently, the COT/TAB part spans the rectangular opening of the carrier frame so that the integrated circuit chip is supported during shipping and handling by its own tape portion. The carrier frames are of sufficient thickness (only a fraction of an inch thick) that they may be stacked one atop another without the integrated circuit chips of adjacent carrier frames contacting one another. In fact, the spacing between the adjacent integrated circuit chips is sufficient that they do not contact and damage one another even if the carrier frames are subjected to jostling and physical shock, as may occur in shipping.

In order to make the stacked carrier frames easily handled in shipping, the frames are given a particular external shape with positioning index features, and an elongate industry-standard shipping tube member is configured to accept the stacked carrier frames. This industry-standard shipping tube member is made in a length sufficient to hold a considerable number of carrier frames. For example, the shipping tube members may be made of sufficient length to each carry about 125 carrier frames stacked adjacent one another.

The conventional practice with such carrier frames and shipping tube members when a number of COT/TAB parts less than the full capacity of the shipping tube member is to be shipped is to fill the remaining volume of the shipping tube with empty carrier frames. Of course this practice results in the necessity to buy large numbers of the carrier frames which are not used to actually carry COT/TAB parts. Also, a considerable weight of empty frames is shipped along with each partially full shipping tube member. An alternative has been to simply fill the empty volume of the partially full shipping tube with an inexpensive, light-weight material such as with a plastic foam block. However, this practice results in a risk to the integrated circuit chips because the carrier frames sometimes slip out of place within the shipping tube member so that the integrated circuit chips are damaged.

Also, the use of such foam blocks to fill the empty volume of the shipping tube members is not entirely satisfactory in another respect because the foam blocks have to be cut to size for each shipment in order to accommodate the empty volume of the shipping tube member for that particular shipment. Of course, a variety of different sizes of pre-cut foam blocks could be provided. However, this solution still requires the acquisition and inventorying of a variety of different sizes of foam blocks to account for the differences in shipment sizes using the industry standard shipping tube members and carrier frames.

SUMMARY OF THE INVENTION

In view of the above-outlined deficiencies of the conventional carrier frame and shipping tube members to allow flexibility in the size of a shipment of COT/TAB integrated circuit chips, a primary object of this invention is to provide a COT/TAB shipping apparatus and method which reduces the necessity to ship empty carrier frames.

Another object for this invention is to provide a COT/TAB shipping tube adaptably receiving industry-standard carrier frame members in numbers easily variable to accommodate different shipment sizes.

Still another object of the present invention is to provide a COT/TAB shipping tube of the above-described character which avoids the necessity to use a filler article or material to hold in place the carrier frames, and the attendant risk that the frames will slip out of place.

Yet another object for the present invention is to provide a COT/TAB shipping tube as described which avoids the conventional disadvantage of having to ship the weight of a filler member along with partial shipment of COT/TAB parts.

In view of the above, the present invention provides a COT/TAB shipping tube which is configured to accept industry-standard carrier frames and which includes means for adjustably receiving and securely holding incremental numbers of the carrier frames, with the remainder of the shipping tube remaining empty.

More particularly, the present invention provides a COT/TAB shipping tube member defining congruent pluralities of spaced apart pairs of apertures in the opposite side walls of the shipping tube. Adjacent side walls of the shipping tube member define pairs of apertures which are interdigitated with one another to provide an increment size for the shipping tube member which is about half that measured out on each of the side walls by the spacing of the apertures. The shipping tube member also includes a pair of adjustably positionable retaining pins which are receivable through the paired apertures to span between opposite walls in side by side relation. Industry-standard carrier frame members are receivable into the shipping tube member in a stack which rests at one end on the paired retaining pins and at the other end is retained by a closure member of the shipping tube. When so disposed in the shipping tube, the carrier frames are securely held with virtually no risk that they will slip out of place within the shipping tube.

Additional objects and advantage of the present invention will appear from a reading of the following detailed description of a single preferred exemplary embodiment of the invention, taken in conjunction with the appended drawing Figures, in which.

DESCRIPTION OF AN EXEMPLARY EMBODIMENT OF THE INVENTION

Figure 1:
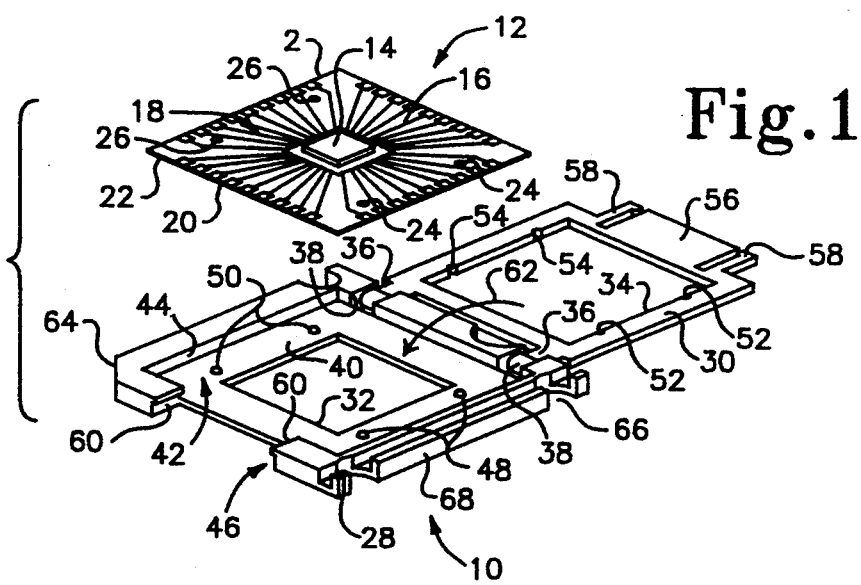
FIG. 1 provides an exploded perspective view of an industry-standard carrier frame assembly receiving a COT/TAB integrated circuit part.

FIG. 1 shows an industry-standard COT/TAB carrier frame assembly 10 about to receive a COT/TAB part 12. The COT/TAB part 12 includes a small size integrated circuit chip 14 which is carried on a tape member 16. The tape member 16 includes a plurality of radially extending conductive traces 18 connecting respective contact pads of the chip 14 (which are too small to be seen on FIG. 1) to respective contact pads 20 near the periphery 22 of the tape member 16. Adjacent two opposite sides thereof the tape member 16 defines pairs of apertures 24, 26.

Viewing the carrier frame assembly 10, it will be seen that this frame assembly includes an open-centered base portion 28 and an open-centered cover portion 30. That is, the base and cover portions 28 and 30 define respective through openings 32, and 34. The portions 28 and 30 are hingably connected to one another by a pair of projections 36 extending from the cover portion 30 pivotally into respective hinge recesses 38 of the base portion.

The base portion 28 includes an inwardly extending flange portion 40 defining the opening 32 and also defining a recess 42 bounded on all sides by upstanding shoulder portions 44 of the base portion. These shoulder portions 44 are continuous about the recess 42 with the exception of openings created by the hinge recesses 38, and an opening 46 opposite these hinge recesses, which latter opening serves as a latching feature for the carrier frame assembly 10, as will be explained.

Recess 42 is sized to receive the COT/TAB part 12. In the recess 42, the flange portion 40 defines two pairs of spaced apart upright pin features 48, 50. These pin features are congruent with and match the apertures 24, 26. Consequently, the COT/TAB part 12 is receivable into the recess 42 to rest upon the flange portion 40 with the pins 48, 50 received into the apertures 24, 26.

The cover portion 30 is sized to also be received into the recess 42 atop of the COT/TAB part 12. This cover member 30 is provided with pairs of notches 52, 54 which partially circumscribe the pins 48, 50. Also, the cover member 30 is provided with a rectangular projection 56 which is accessible through the opening 46 when the carrier frame is closed. Projection 56 may be used to effect opening of the frame. At each side, the projection 56 includes a resilient finger 58 which is engageable with the respective edges 60 of opening 46 to retain the frame in a closed position. As is indicated by the arrow 62, the cover portion 30 is hingably movable into the recess 42 atop of the COT/TAB part 12 into the position seen in FIG. 2. As is visible in each of FIGS. 1 and 2, the carrier frame 10 includes a clipped outer corner 64 and a notch 66 on a side edge 68 located generally diagonally of the clipped corner 64.

Figure 2:
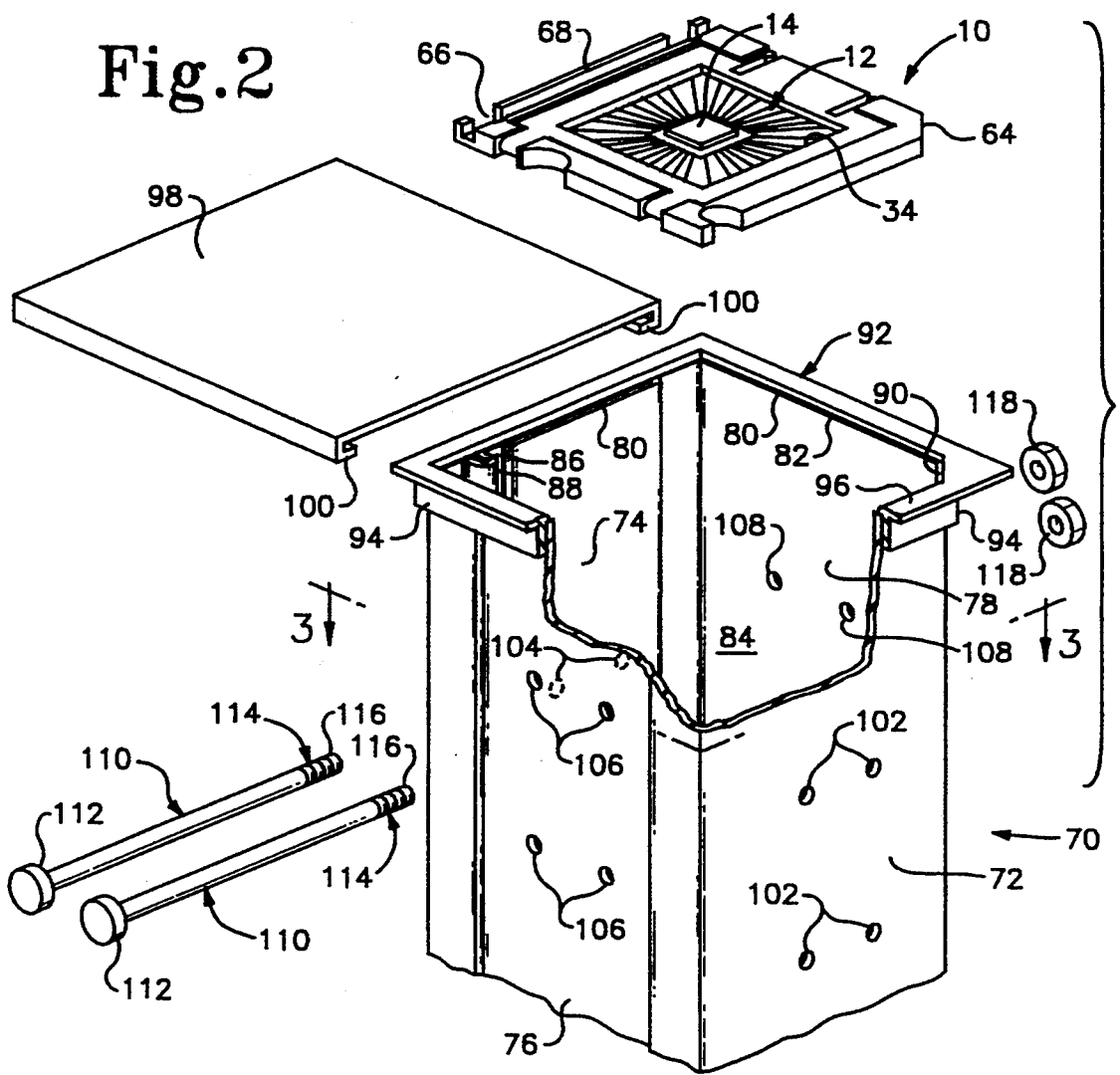
FIG. 2 is a fragmentary exploded perspective view of the combined carrier frame assembly and COT/TAB part of FIG. 1 being received into a shipping tube member embodying the present invention.

Viewing FIG. 2, it is seen that an elongate shipping tube member 70 includes two pairs of opposed elongate side walls 72, 74, and 76, 78. At an end edge 80 common to all of the side walls 72–78, these walls cooperatively define an opening 82 into the elongate interior cavity 84 of the shipping tube member 70. As FIG. 2 illustrates, the one side wall 74 defines a reentrant backfolded portion 86, which defines an elongate rib 88 extending the full length of the wall 74. Generally diagonally of the rib 88, the side walls 72 and 78 cooperatively define an angulated wall portion 90 which corresponds to the clipped corner 64 of the carrier frame 10. Thus, the carrier frames 10 are receivable into the cavity 84 only in a single facial and rotational orientation.

About the opening 82, and generally coextensive with the end edge 80, the shipping tube member 70 is provided with a flange member 92. This flange member 92 includes a longitudinally extending leg portion 94 disposed outside of and permanently secured in engagement with the walls 72–78. As an example only, the leg portion 94 may be adhesively secured to the walls 72–78. Also, the flange member 92 includes an outwardly extending flange portion 96 which completely circumscribes the opening 82.

A conventional shipping tube cover member 98 is receivable on the flange member 92 by engagement of respective rolled over edge portions 100 thereof with opposed parts of the flange portion 96. The conventional cover member 98 includes internal detent features (not shown) which engage the flange member 98 to retain this cover member on the shipping tube member 70. Each end of the shipping tube member 70 is provided with a flange member 92. Thus, each end of the shipping tube member 70 may be closed for shipment of carrier frames 10 therein.

Figure 3:
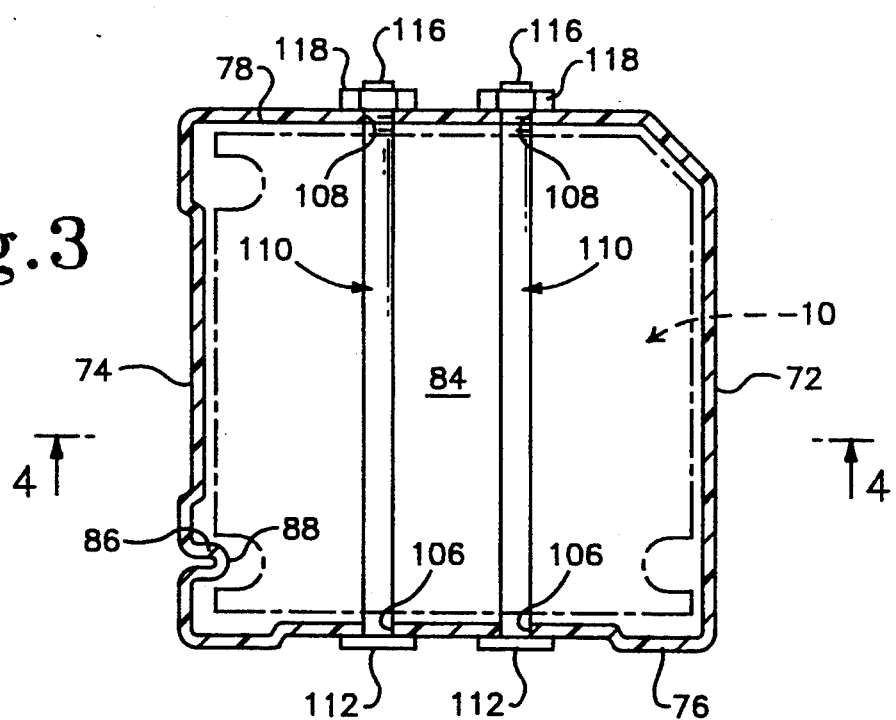
FIGS. 3 and 4 are respective cross sectional plan and elevation views showing the combined carrier frame assemblies with COT/TAB parts disposed in the inventive shipping tube illustrated in FIG. 2.
Figure 4:
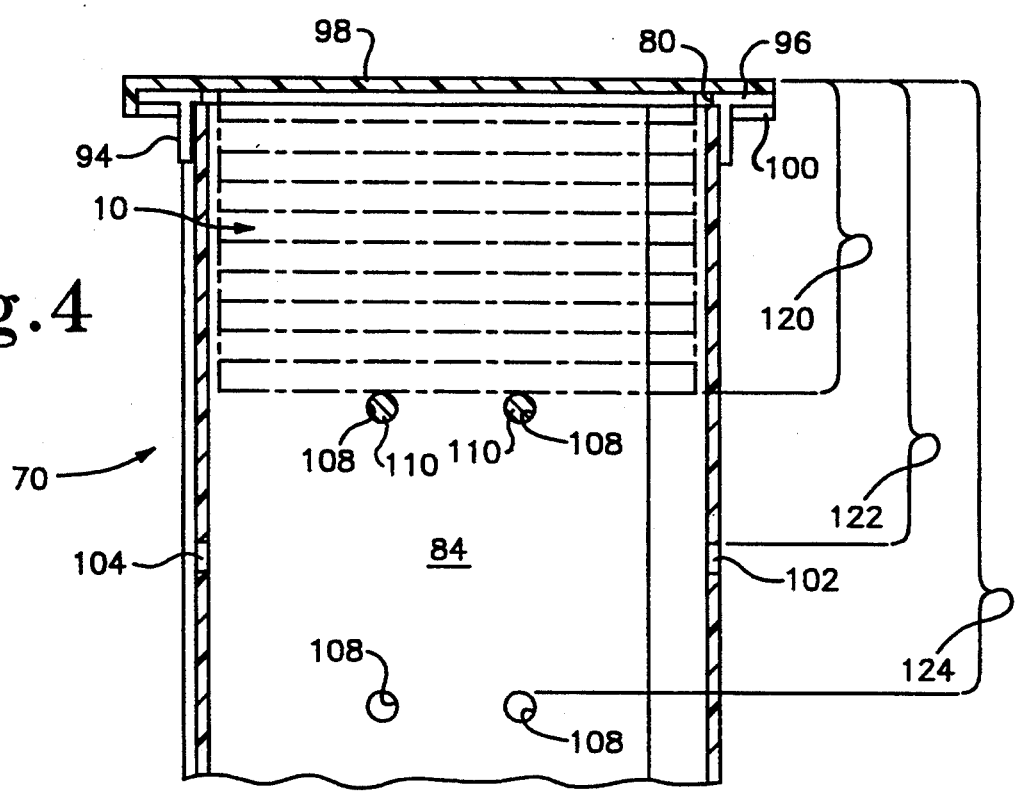

While only a portion of the shipping tube member 70 is shown in FIG. 2, it should be understood that the side walls 72–78 are elongate so that the shipping tube member itself is also elongate, as is seen viewing FIGS. 3 and 4. These side walls may be made of a polymer material, and may preferably be transparent or translucent. The side walls 72–78 may further be simultaneously and integrally formed with one another in an extrusion process, for example. A length of the tubular material resulting from such an extrusion process is cut to length and provided at each end with a flange member 92. In other words, the opposite end of the shipping tube member 70 is the same as that shown in FIG. 2.

Preferably, the shipping tube member 70 may be of such a length that over a hundred of the carrier frame members 10 are receivable into the cavity 84 stacked one atop the other. In order to snugly accept the stacked carrier frames 10 in the event that the shipping tube member 70 is shipped completely full of the carrier frames, the length of the shipping tube member is preferably an integer multiple of the thickness of the carrier frames 10.

In order to allow for variable incremental adjustment of the number of carrier frames which are to be received into the cavity 84, the pairs of side walls 72, 74, and 76, 78, define plural respective pairs of aligned through apertures 102, 104, 106, and 108 spaced along the length of these side walls, viewing FIGS. 2–4. Each of these apertures is of a diameter just slightly larger than the thickness of a carrier frame member 10. Also, the paired apertures are aligned transversely across from one another, with the aperture pairs of one pair of the opposite side walls alternating along the length of the shipping tube member 10 with the aperture pairs of the adjacent pair of side walls.

Receivable into any of the paired apertures 102–108 is a pair of elongate transverse pin members 110. These pin members 110 are of a diameter substantially the same as the thickness of a carrier frame member 10, and are receivable into the apertures 102–108 with a head portion 112 of the pin member bearing against one of the side walls. An opposite terminal end portion 114 of the pin members 110 extends through the opposite aperture of the shipping tube member to extend outwardly therefrom. In order to provide a means for retention of the pin member in the aligned apertures, the terminal end portion 114 defines a thread 116. A deformable plastic nut 118 is provided for engagement with the thread 116 on the terminal end portion 116. This nut 118 is of such a nature that it forms an interference fit with the thread 116 and can be installed onto and removed from the portion 116 with the use of hand tools or a power screw driver, for example. However, the plastic nut is virtually shake proof and will not loosen or fall from the pin 110 due to vibration or handling. Also, it is apparent that alternative means of retaining the pins 110 in the apertures 102–108 can be provided. For example, the terminal end portion 116 of each pin 110 could define a circumferential groove, with a snap ring or E-type ring being used to engage this groove outwardly of the wall of the shipping tube member.

Still alternatively, the terminal end portion of the pin members 110 could be provided with a lengthwise split and an external tapered barb shape leading to a crest of larger diameter than the apertures 102–108, and a shoulder behind this crest. The lengthwise split would allow the barb crest to pass through the apertures 102–108 by deflection of the parts of the terminal end portion 116 on each side of this split so that the shoulder could engage the outer surface of one of the walls 72–78. Consequently, removal of such a retaining pin would require squeezing together of the terminal end portion 116 to allow the shoulder to be forced back through the side wall aperture. Such a design for the pins 110 would eliminate the necessity of using tools to install and remove the pins.

Particularly viewing FIGS. 3 and 4 in conjunction, it is easily seen that a first cavity portion 120 is defined between the cover member 98 and the pair of pins 110. Preferably this first and smallest cavity portion for the shipping tube 70 is sized to accept ten carrier frames 10. Also, a next incrementally larger cavity portion 122 may be defined in the shipping tube 70 by moving the pair of pins 110 to the next lower pairs of apertures. Preferably, this next cavity portion is sized to accept fifteen carrier frames 10. It will be noted that the pair of pins 110 are disposed perpendicularly to their position when they defined the first cavity portion 120. Also, a third cavity portion 124, also larger by five carrier frames than the last cavity portion, may be defined by again disposing the pair of pins 110 in their first orientation but at the next lower aperture pairs along the walls 72, 74.

Thus, successive incrementally larger cavity portions can be defined in the cavity 84 with each (except the last one) being five carrier frames larger than the previous cavity portion in order to accommodate any number of carrier frames in the shipping tube 70 from a minimum of ten to its full capacity. Also, the maximum number of empty carrier frames which might have to be shipped with the full carrier frames in a partially full shipping tube is reduced to a maximum of nine (when only one full carrier frame or nine less than the total capacity of the shipping tube 70 is shipped) or to 4 (when eleven full carrier frames or eleven less than the entire capacity of the shipping tube 70 is shipped, for example). Thus, the weight of empty carrier frames shipped along with the shipping tube 70 and its load of filled carrier frames is reduced to an insubstantial level. Also, determining the number of carrier frames in the shipping tube 70 is much easier with the incremental filling scheme implemented by the present invention.

While the present invention has been depicted, described, and is defined by reference to a particularly preferred embodiment of the inventions, such reference does not imply a limitation on the invention, and no such limitation is to be inferred. The invention is capable of considerable modification, alteration, and equivalents in form and function, as will occur to those ordinarily skilled in the pertinent arts. The depicted and described preferred embodiment of the invention is exemplary only, and is not exhaustive of the scope of the invention. Consequently, the invention is intended to be limited only by the spirit and scope of the appended claims, giving full cognizance to equivalents in all respects.

What is claimed is:

1. A COT/TAB part shipping container apparatus for receiving plural like COT/TAB part carrier frames stacked one upon the other, said shipping container apparatus comprising:

an elongate shipping container tube member including two pairs of opposed elongate side walls cooperatively defining an elongate cavity therewithin and at coextensive end edges thereof cooperatively defining an opening into said cavity;

means for selectively opening and closing said opening into said cavity;

said side walls defining plural pairs of transversely aligned apertures spaced along the length of said elongate cavity; and a pair of elongate pin members receivable into a selected pair of said paired apertures to extend transversely between said opposed pairs of side walls and to supportingly engage a carrier frame placed in said elongate cavity;

whereby said elongate cavity may receive an incrementally variable number of said carrier frames stacked between said opening and said pair of pins, dependent upon the distance of said selected pair of apertures from said opening;

wherein one pair of said two pair of opposed side walls defines pairs of apertures which are aligned with one another transversely across said cavity, the other pair of said two pairs of opposed side walls also defining pairs of apertures which are aligned with one another transversely across said cavity, and said aperture pairs of said one pair of side walls being spaced from said aperture pairs of said other pair of side walls along the length of said elongate cavity by an integer multiple of a predetermined distance.

2. The shipping container apparatus of claim 1 wherein each pin of said pair of pin members includes a head bearing on one of said pair of opposed side walls and a terminal end portion passing through a side wall aperture opposite said head.

3. The shipping container apparatus of claim 2 wherein said end termination portion includes means for releasably retaining said pin member in engagement with said side wall aperture.

4. The shipping container apparatus of claim 3 wherein said releasable retaining means includes said end termination portion defining a thread, and a nut member having a elastically deformable portion threadably receivable on said thread of said pin member.

5. The shipping container apparatus of claim 4 wherein said nut member is formed of elastically deformable material.

6. The shipping container apparatus of claim 1 wherein said pairs of apertures and said pin members each have a diameter substantially the same as said predetermined distance.

7. The shipping container apparatus of claim 6 wherein said plural pairs of apertures are spaced along said side walls to define separation distances therebetween which are integer multiples of said predetermined distance.

8. The shipping container apparatus of claim 7 wherein said integer multiple is four or nine.

9. The shipping container apparatus of claim 1 wherein said integer multiple is four.

10. The shipping container apparatus of claim 1 wherein said means for selectively opening and closing said opening includes said shipping tube member carrying a flange member circumscribing said opening, said flange member defining a circumferential flange portion extending outwardly around said opening, and a cover member including a pair of opposed rolled over edge portions spaced apart and engageable onto said flange portion.

* * * * *